us010964855B2

(12) United States Patent
Tian et al.

(10) Patent No.: US 10,964,855 B2
(45) Date of Patent: Mar. 30, 2021

(54) METHOD FOR MANUFACTURING MICRO LIGHT-EMITTING DIODE ARRAY SUBSTRATE

(71) Applicants: BEIJING BOE OPTOELECTRONICS TECHNOLOGY CO., LTD., Beijing (CN); BOE TECHNOLOGY GROUP CO., LTD., Beijing (CN)

(72) Inventors: Ting Tian, Beijing (CN); Shuqian Dou, Beijing (CN); Xiaoliang Fu, Beijing (CN); Liguang Deng, Beijing (CN); Dayong Zhou, Beijing (CN); Zhiqiang Fan, Beijing (CN); Yongjie Han, Beijing (CN); Yawen Zhang, Beijing (CN); Zhongjun Wang, Beijing (CN); Dong Zhang, Beijing (CN); Yu Liu, Beijing (CN); Zheran Li, Beijing (CN); Hyungkyu Kim, Beijing (CN)

(73) Assignees: BEIJING BOE OPTOELECTRONICS TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/553,250

(22) Filed: Aug. 28, 2019

(65) Prior Publication Data
US 2020/0313046 A1 Oct. 1, 2020

(30) Foreign Application Priority Data

Mar. 27, 2019 (CN) .......................... 201910238711.5

(51) Int. Cl.
*H01L 33/00* (2010.01)
*H01L 25/075* (2006.01)
(Continued)

(52) U.S. Cl.
CPC ........ *H01L 33/504* (2013.01); *H01L 25/0753* (2013.01); *H01L 33/005* (2013.01);
(Continued)

(58) Field of Classification Search
CPC ... H01L 25/0753; H01L 25/167; H01L 25/13; H01L 25/0756; H01L 33/504;
(Continued)

(56) References Cited

U.S. PATENT DOCUMENTS

| 10,068,888 B2 * | 9/2018 | Zhang .................. H01L 33/0093 |
| 10,096,740 B1 * | 10/2018 | Chen ...................... H01L 27/156 |
| 2017/0179097 A1 * | 6/2017 | Zhang .................... H01L 27/156 |

FOREIGN PATENT DOCUMENTS

| CN | 207217575 U | 4/2018 |
| CN | 108538878 A | 9/2018 |

(Continued)

OTHER PUBLICATIONS

First Chinese Office Action dated Dec. 3, 2019.

*Primary Examiner* — Nikolay K Yushin
(74) *Attorney, Agent, or Firm* — Dilworth & Barrese, LLP.; Michael J. Musella, Esq.

(57) ABSTRACT

A method for manufacturing a micro light-emitting diode array substrate is disclosed. The method includes: providing a drive substrate comprising a plurality of sub-pixel regions, the plurality of sub-pixel regions being configured for bearing micro light-emitting diodes of different colors, and epitaxial layers of the micro light-emitting diodes of different colors having different thicknesses; providing a base substrate, forming a plurality of micro light-emitting diodes on the base substrate, and transferring micro light-emitting diodes of same color on the base substrate as a whole onto the drive substrate; repeating the transferring process in a sequence that the thicknesses of the epitaxial layers of the (Continued)

micro light-emitting diodes gradually increase, until each sub-pixel region in pixel units is provided with one of the micro light-emitting diodes having same color as the each sub-pixel region.

17 Claims, 5 Drawing Sheets

(51) Int. Cl.
*H01L 33/50* (2010.01)
*H01L 33/62* (2010.01)

(52) U.S. Cl.
CPC ...... *H01L 33/62* (2013.01); *H01L 2933/0041* (2013.01); *H01L 2933/0066* (2013.01)

(58) Field of Classification Search
CPC .................. H01L 33/005; H01L 33/62; H01L 2933/0041; H01L 2933/0066; H01L 2933/005; H01L 2933/0058; H01L 2933/0083
See application file for complete search history.

(56) References Cited

FOREIGN PATENT DOCUMENTS

| | | |
|---|---|---|
| CN | 109326549 A | 2/2019 |
| CN | 109496368 A | 3/2019 |

\* cited by examiner

METHOD FOR MANUFACTURING MICRO LIGHT-EMITTING DIODE ARRAY SUBSTRATE

CROSS REFERENCE TO RELATED APPLICATIONS

The present application claims priority to Chinese Patent Application No. 201910238711.5 filed on Mar. 27, 2019, and titled "Method FOR Manufacturing Micro Light-emitting Diode Array Substrate", the disclosure of which is incorporated herein by reference in its entirety as part of the present application.

TECHNICAL FIELD

Embodiments of the present disclosure relate to a method for manufacturing a micro light-emitting diode array substrate.

BACKGROUND

Currently, a micro light-emitting diode (Micro-LED) display has received more and more attention, and a Micro-LED display screen has a power-saving characteristic, and is applicable to wearable devices such as augmented reality (AR)/virtual reality (VR) helmets and smart watches, and also applicable to outdoor display billboards, head up displays (HUD) and the like. In addition, the Micro-LED display screen also has promising application prospects in the fields of taillights, wireless optical communication (such as Light Fidelity, Li-Fi for short), projectors and the like. A Micro-LED is mainly obtained by miniaturizing, arraying and thinning a conventional light-emitting diode crystal film by means of a miniature process technology, then transferring the crystal film onto a drive circuit substrate by means of a transfer technology, manufacturing a protective layer through physical deposition, and finally completing packaging.

SUMMARY

Embodiments of the present disclosure provide a method for manufacturing a micro light-emitting diode array substrate, the method comprises:

providing a drive substrate, the drive substrate comprising a plurality of sub-pixel regions, the plurality of sub-pixel regions being configured for bearing micro light-emitting diodes of different colors, and epitaxial layers of the micro light-emitting diodes of different colors having different thicknesses;

providing a base substrate, forming a plurality of micro light-emitting diodes on the base substrate, and transferring micro light-emitting diodes of same color on the base substrate as a whole onto the drive substrate; and repeating the transferring the micro light-emitting diodes of same color on the base substrate as a whole onto the drive substrate in a sequence that the thicknesses of the epitaxial layers of the micro light-emitting diodes gradually increase, until each sub-pixel region in pixel units is provided with one of the micro light-emitting diodes having same color as the each sub-pixel region.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

Figure 1:
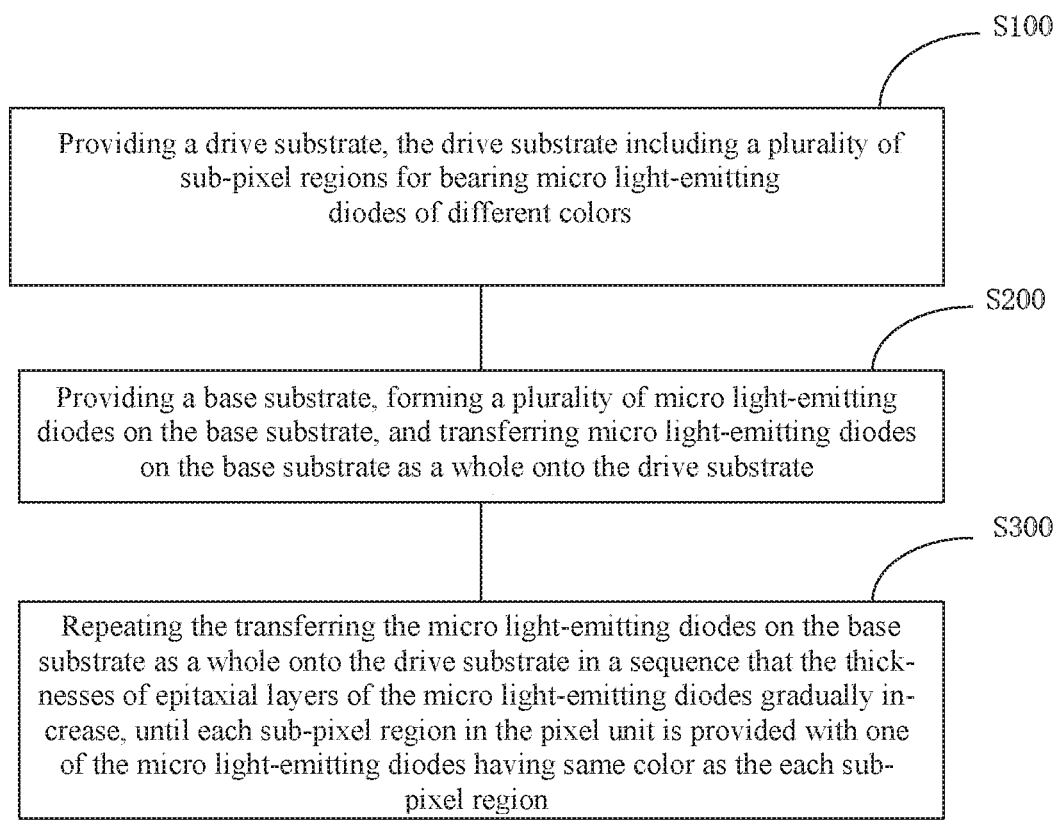
FIG. 1 is a flow chart of a method for manufacturing a micro light-emitting diode array substrate according to one embodiment of the present disclosure.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present disclosure, are not intended to indicate any sequence, amount or importance, but distinguish various components. The terms "comprises," "comprising," "includes," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

Currently, a method for manufacturing a micro light-emitting diode array substrate has the problem of low efficiency or inability to manufacture a large-sized colored micro light-emitting diode array substrate. For example, the method for manufacturing the micro light-emitting diode array substrate mainly comprises a chip bonding method and a wafer bonding method.

According to the chip bonding method: firstly a traditional light-emitting diode is cut into micron-sized micro light-emitting diodes, and then the micro light-emitting diodes are separated from a growth substrate; finally, by using the surface mounting technology (SMT), the micro light-emitting diodes are bonded onto a drive circuit substrate one by one, and the micro light-emitting diodes are transferred so that intervals thereof can be adjusted to a density of desired display pixels. There are two technological difficulties in the method: firstly, because sizes of the micro light-emitting diodes are extremely small, a very refined operating technology is needed. Secondly, tens of thousands of or even millions of micro-light-emitting diodes need to be moved in a single transfer, for example, in an HD product with a resolution of 720×1280, it is necessary to transfer 720×3×1280=2764800 micro-light-emitting diodes; the quantity is huge, and it is inefficient, so a new technology is needed to meet this requirement.

According to the wafer bonding method: firstly, a traditional light-emitting diode is made into micron-sized micro light-emitting diodes; then both the micro light-emitting diodes and a growth substrate are directly bonded onto a drive circuit substrate; finally, the growth substrate is stripped off, and the micro light-emitting diodes are bonded onto the drive circuit substrate to form display pixels. Transferring one by one is not needed for the method, which can improve transferring efficiency of the micro light-emitting diodes; however, the method is commonly used for manufacturing a small-sized display device, such as a micro display device for near-to-eye or projection display application, because a size of a substrate (a sapphire or gallium nitride GaN substrate) for growing the micro light-emitting diodes is generally 4 inches or less. In addition, because the light-emitting diodes have different wavelength ranges, a full-color micro light-emitting diode cannot be manufactured on a single substrate through current technology, that is to say, it is difficult to achieve manufacturing of a full-color micro light-emitting diode array substrate by using the wafer bonding method.

Although there exists in the prior art a method for applying a color filter to a single-color micro light-emitting diode display panel to produce a full-color micro light-emitting diode display screen, a luminous efficiency provided by this method is not high. Thus, manufacturing of the large-sized full-color micro light-emitting diode array substrate still cannot be achieved effectively.

According to an embodiment of the present disclosure, a method for manufacturing of a micro light-emitting diode array substrate is provided, and referring to FIG. 1, the method comprises:

S100: Providing a drive substrate, the drive substrate including a plurality of sub-pixel regions for bearing micro light-emitting diodes of different colors.

For example, in the step, the drive substrate refers to a substrate including a drive circuit. For example, the drive circuit includes electrodes bonded with the micro light-emitting diodes. The drive substrate includes a display region and a non-display region, wherein the display region includes a plurality of pixel units, and each pixel unit includes a plurality of sub-pixel regions for bearing the micro light-emitting diodes of different colors. Thus, after micro light-emitting diodes having same color as the sub-pixel regions are arranged in the sub-pixel regions through subsequent steps, a colored pixel array can be formed on the substrate, so that a colored micro light-emitting diode array substrate can be obtained.

Figure 6:
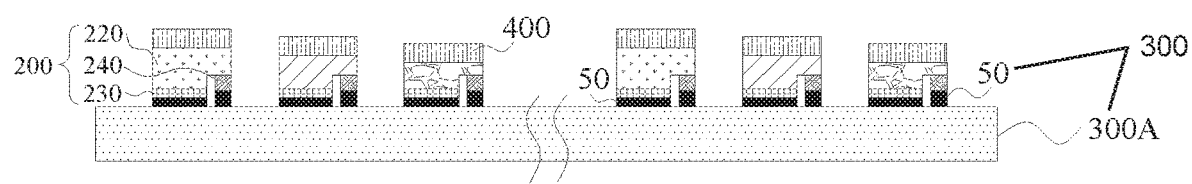
FIG. 6 is a structural schematic diagram of a micro light-emitting diode array substrate according to another embodiment of the present disclosure.

For example, referring to FIG. 6, a drive substrate 300 includes drive circuit electrodes 50, and bonding with micro light-emitting diodes 200 can be achieved in the subsequent steps through the drive circuit electrodes 50. For example, the drive circuit further includes a low temperature polycrystalline silicon (LTPS) or metallic oxide (IGZO) thin film transistor array.

S200: Providing a base substrate, forming a plurality of micro light-emitting diodes on the base substrate, and transferring micro light-emitting diodes having the same color on the base substrate as a whole onto the drive substrate.

For example, in the step, the base substrate has a plurality of micro light-emitting diodes arranged in an array and of the same color, and the micro light-emitting diodes having the same color on the base substrate are transferred into sub-pixels having the same as the micro light-emitting diodes on the drive substrate by means of electrode bonding. In the above transferring process, the micro light-emitting diodes are transferred onto the drive substrate along with the base substrate, and the base substrate is removed subsequently. Because the micro light-emitting diodes are not needed to be transferred one by one in the method, an overall transfer of the micro light-emitting diodes on the base substrate can be achieved, high transferring efficiency is achieved, and intervals between the micro light-emitting diodes of different colors on the drive substrate can be effectively controlled.

In the step, the micro light-emitting diodes having the same color on the base substrate are transferred as a whole onto the drive substrate. In this way, the intervals between the micro light-emitting diodes on the drive substrate can be effectively controlled, the micro light-emitting diodes are not needed to be transferred one by one in the method, and the transferring efficiency of the micro light-emitting diodes can be increased.

S300: Repeating the transferring the micro light-emitting diodes on the base substrate as a whole onto the drive substrate in a sequence that the thicknesses of epitaxial layers of the micro light-emitting diodes gradually increase, until each sub-pixel region in the pixel unit is provided with one of the micro light-emitting diodes having same color as the each sub-pixel region.

The plurality of micro light-emitting diodes have different colors, and thus, the transferring the micro light-emitting diodes on the base substrate can be repeated several times according to the different colors of the micro light emitting diodes, until each of the plurality of sub-pixel regions in the pixel unit is provided with the micro light-emitting diode having the same color as the sub-pixel region. The micro light-emitting diodes may have various colors, such as red, green and blue mentioned in subsequent embodiments. According to the different colors, the micro light-emitting diodes are transferred onto the drive substrate in batches, and pixel arrays having different colors are obtained, as a result, the colored micro light-emitting diode array substrate is obtained efficiently, and full-color display is achieved. A specific color of the micro light-emitting diodes having the same color on the base substrate is not particularly limited, and can be designed by those skilled in the art according to the requirement of an actual color. For example, according to the embodiment of the present disclosure, the micro light-emitting diodes includes a blue micro light-emitting diode, a green micro light-emitting diode, and a red micro light-emitting diode.

In the step, the thicknesses of the epitaxial layers of the micro light-emitting diodes of different colors are different from one another, and the micro light-emitting diodes of different colors on the base substrate are sequentially transferred in the sequence that the thicknesses of the epitaxial layers of the micro light-emitting diodes gradually increase. In this way, the sub-pixel regions of different colors on the substrate are all provided with the micro light-emitting diodes corresponding to them in color. In other words, each of the sub-pixel regions has a same color as the micro light-emitting diode disposed therein. Thus, the pixel arrays having different colors are obtained, and the colored micro light-emitting diode array substrate can be obtained efficiently in the method. In embodiments of the present disclosure, each of the micro light-emitting diodes has an epitaxial layer, and the thicknesses of epitaxial layers of the micro light-emitting diodes of different colors are different from one another. For example, the thicknesses of epitaxial layers of the blue micro light-emitting diode, the green micro light-emitting diode and the red micro light-emitting diode gradually increase. Thus, in the transferring process, the micro light-emitting diode having a smaller thickness of epitaxial layer is firstly transferred, then the micro light-emitting diode having a greater thickness of epitaxial layer is transferred, and accordingly, it can be prevented that the micro light-emitting diode which is transferred first is extruded and damaged by the micro light-emitting diode which is transferred later, and preparation of the colored micro light-emitting diode array substrate can be simply and efficiently implemented.

Figure 2:
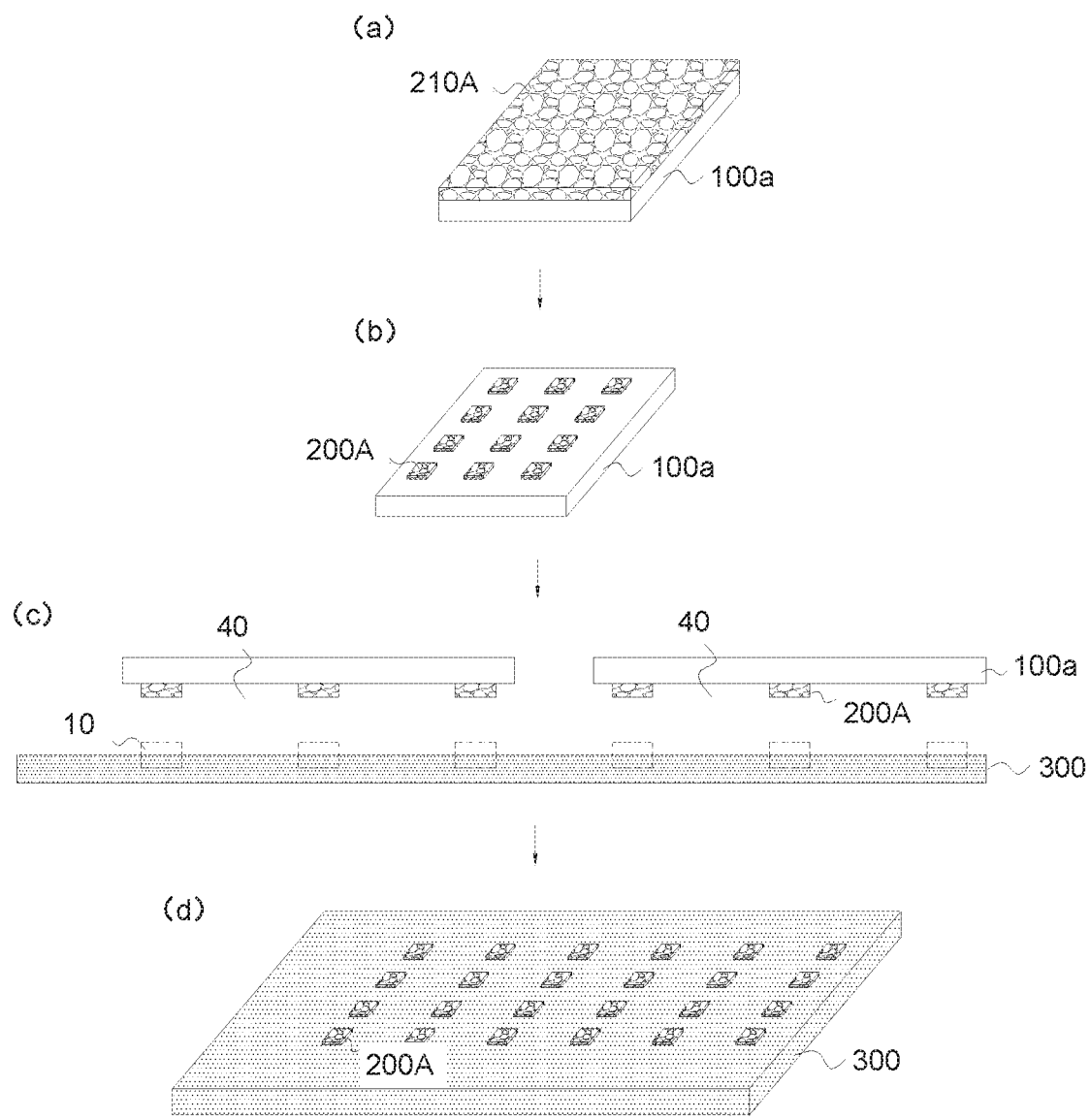
FIG. 2 is a partial flow chart of a method for manufacturing the micro light-emitting diode array substrate according to one embodiment of the present disclosure.

According to the embodiment of the present disclosure, the micro light-emitting diodes include blue, green and red micro light-emitting diodes, thicknesses of epitaxial layers of the blue light, green light and red micro light-emitting diodes gradually increase, and the process of transferring the micro light-emitting diodes is as follows:

Firstly, referring to (c) in FIG. 2, blue micro light-emitting diodes 200A formed on a first base substrate 100a are transferred as a whole onto first sub-pixel regions 10 corresponding to the blue micro light-emitting diodes 200A in color on the drive substrate 300, and the drive substrate 300 (as show in (d) in FIG. 2) only provided with the blue micro light-emitting diodes 200A is obtained. A blank region 40 is formed between two adjacent blue micro light-emitting diodes 200A on the first base substrate 100a, and a region corresponding to the blank region 40 on the drive substrate 300 is used for arranging a green micro light-emitting diode 200B and a red micro light-emitting diode 200C.

Figure 3:
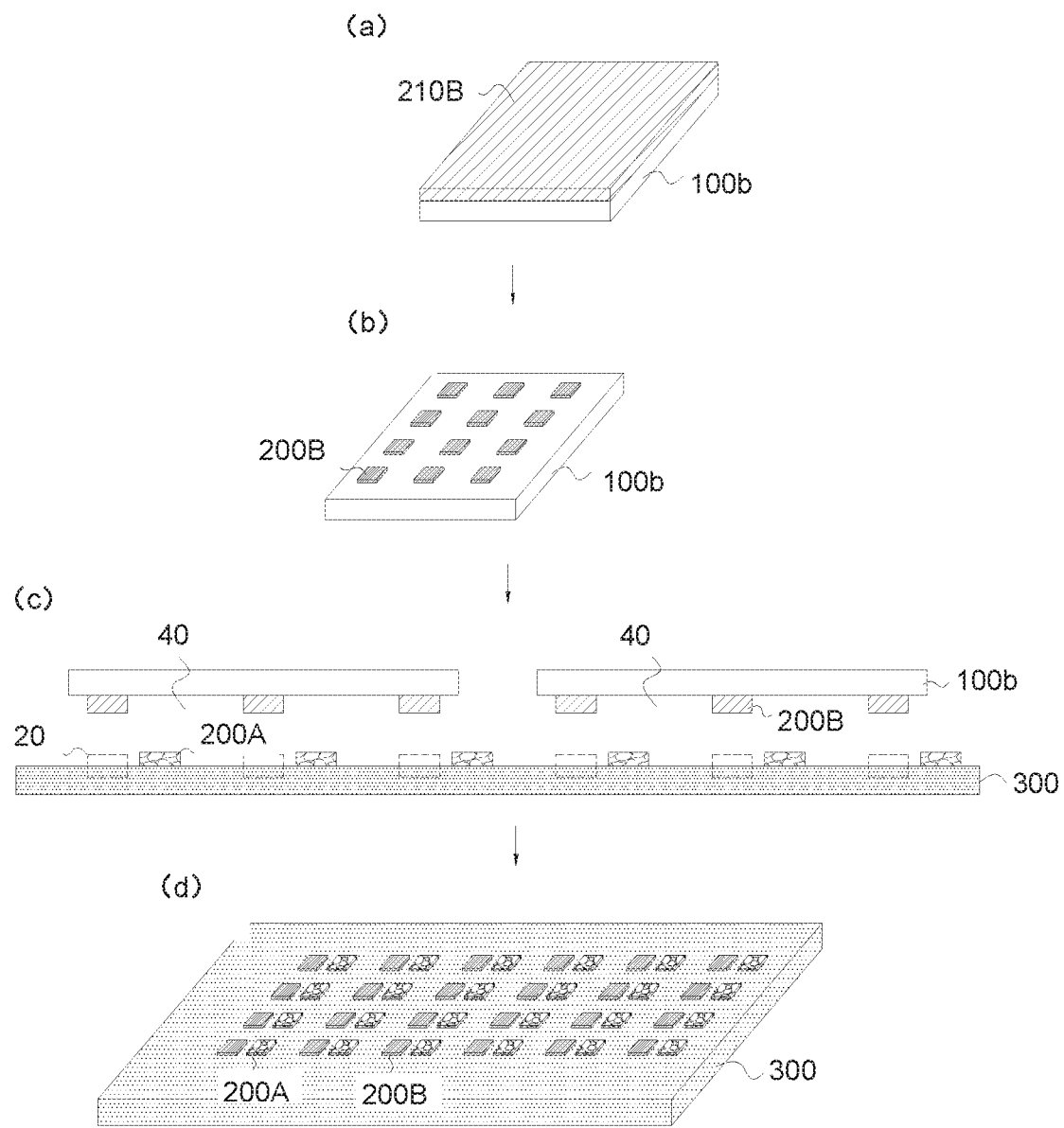
FIG. 3 is a partial flow chart of a method for manufacturing a micro light-emitting diode array substrate according to another embodiment of the present disclosure.

Then, referring to (c) in FIG. 3, the green micro light-emitting diodes 200B formed on a second base substrate 100b are transferred as a whole onto second sub-pixel regions 20 corresponding to the green micro light-emitting diodes 200B in color on the drive substrate 300, and the drive substrate 300 (as show in (d) in FIG. 3) provided with the blue micro light-emitting diodes 200A and the green micro light-emitting diodes 200B is obtained. A blank region 40 is formed between two adjacent green micro light-emitting diodes 200B on the second base substrate 100b, and a region corresponding to the blank region 40 on the drive substrate 300 is used for arranging the blue micro light-emitting diode 200A and the red micro light-emitting diode 200C.

Figure 4:
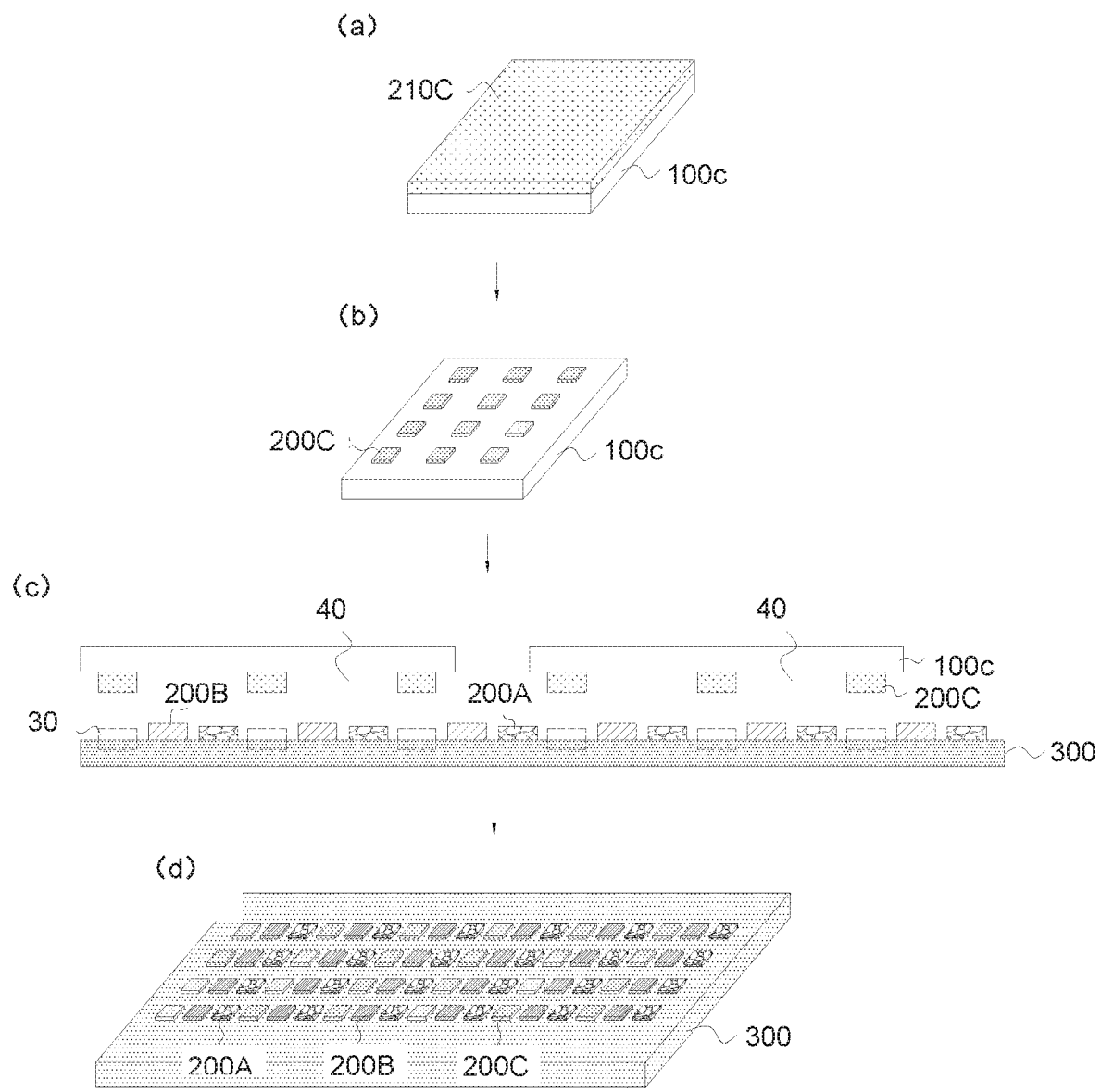
FIG. 4 is a partial flow chart of a method for manufacturing the micro light-emitting diode array substrate according to another embodiment of the present disclosure.

Next, referring to (c) in FIG. 4, after the blue micro light-emitting diodes 200A and the green micro light-emitting diodes 200B are formed on the drive substrate, the red micro light-emitting diodes 200C formed on a third base substrate 100c are transferred as a whole onto third sub-pixel regions 30 corresponding to the red micro light-emitting diodes 200C in color on the drive substrate 300, and the drive substrate 300 (as show in (d) in FIG. 4) provided with the blue micro light-emitting diodes 200A, the green micro light-emitting diodes 200B, and the red micro light-emitting diodes 200C is obtained. A blank region 40 is formed between two adjacent red micro light-emitting diodes 200C on the third base substrate 100c, and a region corresponding to the blank region 40 on the drive substrate 300 is used for arranging the blue micro light-emitting diode 200A and the green micro light-emitting diode 200B.

According to the embodiment of the present disclosure, referring to (c) in FIG. 2, a blank region 40 is formed between two micro light-emitting diodes 200 on the first base substrate 100a, the two micro light-emitting diodes 200 correspond to two adjacent pixel units in the same row. In this way, the micro light-emitting diode corresponds to the position of the sub-pixel region having the same color as the micro light-emitting diode, so that the micro light-emitting diode can be conveniently arranged in the sub-pixel region.

For example, the micro light-emitting diodes includes any one of a blue micro light-emitting diode, a green micro light-emitting diode, and a red micro light-emitting diode, a blank region 40 is formed between two micro light-emitting diodes 200 on the first base substrate 100a corresponding to two adjacent pixel units in the same row. For example, in the case that the micro light-emitting diodes includes the blue micro light-emitting diode, the blue micro light-emitting diode 200A is allowed to correspond to the first sub-pixel region 10 of blue color, thus, it is possible to facilitate arranging the blue micro light-emitting diode 200A in the first sub-pixel region 10 of blue color (as illustrated in (c) in FIG. 2). For another example, in the case that the micro light-emitting diodes includes the green micro light-emitting diode, the green micro light-emitting diode 200B is allowed to correspond to the second sub-pixel region 20 of green color, thus, it is possible to facilitate arranging the green micro light-emitting diode 200B in the second sub-pixel region 20 of green color (as illustrated in (c) in FIG. 3). For another example, in the case that the micro light-emitting diodes includes the red micro light-emitting diode, the red micro light-emitting diode 200C is allowed to correspond to the third sub-pixel region 30 of red color, thus, it is possible to facilitate arranging the red micro light-emitting diode 200C in the third sub-pixel region 30 of red color (as illustrated in (c) in FIG. 4).

That is to say, a region of the drive substrate 300, which corresponds to the blank region 40 between two adjacent blue micro light-emitting diodes 200A on the first base substrate 100a, is the region for arranging the green micro light-emitting diode 200B and the red micro light-emitting diode 200C. A region of on the drive substrate 300, which corresponds to the blank region 40 between two adjacent green micro light-emitting diodes 200B on the second base substrate 200a, is the region for arranging the blue micro light-emitting diode 200A and the red micro light-emitting diode 200C. A region of the drive substrate 300, which corresponds to the blank region 40 between two adjacent red micro light-emitting diodes 200C on the third base substrate 300a, is the region for arranging the blue micro light-emitting diode 200A and the green micro light-emitting diode 200B. That is to say, while the micro light-emitting diode is formed on the base substrate, a distance between two adjacent micro light-emitting diodes is set to be consistent with a distance between two adjacent sub-pixel regions having same color as the two adjacent micro light-emitting diodes, and meanwhile, a size of the micro light-emitting diode is set to be consistent with a size of the sub-pixel region having same color as the micro light-emitting diode, so as to arrange the micro light-emitting diode directly in the sub-pixel region having the same color as the micro light-emitting diode in the transferring process.

In other words, the pixel units on the drive substrate are distributed in rows and columns, and a plurality of sub-pixel regions are arranged in each pixel unit. For example, the pixel unit consists of sub-pixels of three colors, in the case that the sub-pixels in two adjacent pixel units of the same row has same one of the three colors, a region for arrange sub-pixels of the other two colors is provided between the sub-pixels. For example, a region for arranging the green sub-pixel and the red sub-pixel is provided between the blue sub-pixels in two adjacent pixel units in the same row, and the above region is consistent with the blank region between the two adjacent blue micro light-emitting diodes on the first base substrate. That is to say, the micro light-emitting diode is provided on the first base substrate only at a position corresponding to the corresponding sub-pixel region, for example, on the first base substrate provided with the blue micro light-emitting diode; only the position corresponding to the blue sub-pixel is provided with the blue micro light-emitting diode, positions corresponding to the red and green sub-pixel regions are not provided with the blue micro light-emitting diode, so as to facilitate arranging the micro light-emitting diode directly at the position of the sub-pixel region having the same color as the micro light-emitting diode in the transferring process.

According to the embodiment of the present disclosure, the red micro light-emitting diode is of an inverted structure, and the blue micro light-emitting diode and the green micro light-emitting diode can be of an inverted structure, alternatively, the blue micro light-emitting diode and the green micro light-emitting diode can also be of an upright installing structure (non-inverted structure), as long as two electrodes of the above micro light-emitting diode are both located on a same side of the micro light-emitting diode, and thus, the two electrodes can be bonded onto drive circuit electrodes, facilitating the transfer of the micro light-emitting diode.

For example, referring to FIG. 6, each micro light-emitting diode 200 includes an epitaxial layer 220, and further includes a first electrode 230 and a second electrode 240 arranged on one side of the epitaxial layer 220. For example, in the process of transferring the micro light-emitting diode 200, the first electrode 230 and the second electrode 240 are bonded to the drive circuit electrodes 50 on the drive substrate 300 to arrange the micro light-emitting diode on the substrate. For example, the drive substrate 300 includes a base substrate 300A and a drive circuit electrode 50 formed on the base substrate 300A.

According to the embodiment of the present disclosure, referring to FIG. 2, the blue micro light-emitting diode is formed through steps of: firstly, growing a semiconductor material layer 210A (as illustrated in (a) in FIG. 2) for forming the blue micro light-emitting diode on the first base substrate 100a, then forming a plurality of epitaxial layers arranged in an array by performing a patterning process on the semiconductor material layer 210A, and finally arranging a first electrode and a second electrode on a side of the epitaxial layer away from the first base substrate 100a, and an area of the first electrode being greater than an area of the second electrode. As a result, the blue micro light-emitting diode 200A (as illustrated in (b) in FIG. 2) is obtained. Thus, the blue micro light-emitting diode can be obtained through a simple method.

According to the embodiment of the present disclosure, referring to FIG. 3, similarly, the green micro light-emitting diode is formed through steps of: firstly, growing a semiconductor material layer 210B (as illustrated in (a) in FIG. 3) for forming the green micro light-emitting diode on the first base substrate 100a, then forming a plurality of epitaxial layers arranged in an array by performing a patterning process on the semiconductor material layer 210B, and finally arranging a first electrode and a second electrode on a side of the epitaxial layer away from the first base substrate 100a, and an area of the first electrode being greater than an area of the second electrode. As a result, the green micro light-emitting diode 200B (as illustrated in (b) in FIG. 3) is obtained. Thus, the green micro light-emitting diode can be obtained through a simple method.

According to the embodiment of the present disclosure, the base substrate for growing the blue micro light-emitting diode and the green micro light-emitting diode is an insulation substrate, such as a sapphire substrate. Thus, a suitable substrate can be provided for preparation of the blue micro light-emitting diode and the green micro light-emitting diode.

A method for forming the red micro light-emitting diode is not limited particularly and can be designed by those skilled in the art according to the specific condition, as long as the red micro light-emitting diode having the inverted structure can be obtained. For example, according to the embodiment of the present disclosure, referring to FIG. 4, the red micro light-emitting diode is formed through steps of: firstly, growing a semiconductor material layer for forming the red micro light-emitting diode on a transfer substrate, then transferring the semiconductor material layer on the transfer substrate onto the third base substrate 100c, removing the transfer substrate, next, forming a plurality of epitaxial layers arranged in an array by performing a patterning process on the semiconductor material layer 210C (as illustrated in (a) in FIG. 4) on the third base substrate 100c, and finally arranging a first electrode and a second electrode on a side of the epitaxial layer away from the third base substrate 100c, and an area of the first electrode being greater than an area of the second electrode. As a result, the red micro light-emitting diode 200C (as illustrated in (b) in FIG. 4) is obtained. Thus, the red micro light-emitting diode having the inverted structure can be obtained through a simple method.

A specific material of the transfer substrate is not limited particularly and can be designed by those skilled in the art according to a specific condition, as long as it can be used for growing the red micro light-emitting diode. For example, according to the embodiment of the present disclosure, the transfer substrate for growing the red micro light-emitting diode can be a gallium arsenide substrate, and the base substrate for arranging the red micro light-emitting diode subsequently is an insulation substrate, such as a silicon substrate or a ceramic substrate. Thus, a suitable substrate can be provided for preparation of the red micro light-emitting diode. According to the embodiment of the present disclosure, the transfer substrate can be removed by using a wet etching method.

According to the embodiment of the present disclosure, after the micro light-emitting diode on the base substrate is transferred onto the corresponding sub-pixel region on the substrate, the method further comprises stripping off the base substrate so as to complete the transferring process of the micro light-emitting diode. According to the embodiment of the present disclosure, a method of stripping off the base substrate can include wet etching, dry etching and laser stripping. For example, in the case that the base substrate is a sapphire substrate, the laser stripping can be adopted; and in the case that the base substrate is a silicon substrate or a ceramic substrate, the wet etching, dry etching or laser stripping can be adopted.

According to the embodiment of the present disclosure, the thicknesses of the epitaxial layers of the micro light-emitting diodes of different colors are different from one another, for example, the thicknesses of the epitaxial layers of the blue micro light-emitting diode, the green micro light-emitting diode and the red micro light-emitting diode gradually increase. Thus, in the transferring process, the micro light-emitting diode having a smaller thickness of epitaxial layer is firstly transferred, then the micro light-emitting diode having a greater thickness of epitaxial layer is transferred. Accordingly, it can be prevented that the micro light-emitting diode which is transferred first is extruded and damaged by the micro light-emitting diode which is transferred later, and preparation of the colored micro light-emitting diode array substrate can be simply and efficiently implemented.

According to the embodiment of the present disclosure, among the micro light-emitting diodes and the sub-pixel regions having the same color as the micro light-emitting diodes, a total number of the sub-pixel regions can be an integral multiple of a total number of the micro light-emitting diodes on each base substrate. That is to say, the display region on the substrate can be divided into a plurality of sub-display regions of the same size, and the micro light-emitting diodes of different colors can be respectively transferred in each sub-display region by using the method of the embodiment of the present disclosure, in this way, the large-sized colored micro light-emitting diode array substrate can be obtained, and application scenarios of the micro light-emitting diode array substrate can be various.

Figure 5:
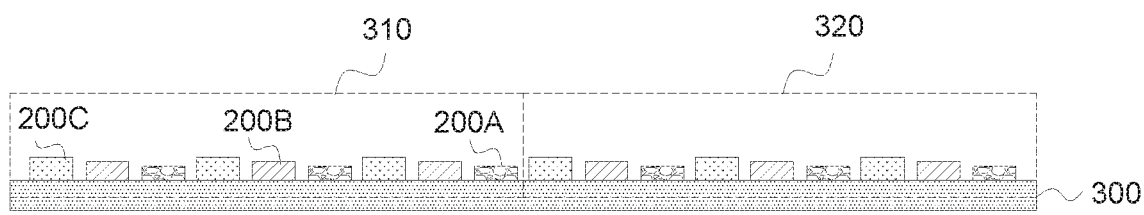
FIG. 5 is a structural schematic diagram of a micro light-emitting diode array substrate according to one embodiment of the present disclosure.

According to the embodiment of the present disclosure, a size of the sub-display region can be consistent with (i.e., same as) a size of the base substrate, and a number of the sub-display regions on the substrate can be designed according to a size of an actual array substrate. For example, according to the embodiment of the present disclosure, referring to FIG. 5, the display region on the drive substrate 300 can be divided into two, such as a first display region 310 and a second display region 320, and the micro light-emitting diodes can be respectively arranged in the first display region 310 and the second display region 320 by using the above-mentioned method provided by the embodiments of the present disclosure, so as to obtain the large-sized colored micro light-emitting diode array substrate.

In addition, the inventor finds that when the semiconductor material layer of the micro light-emitting diode is irradiated by light, photons can be absorbed by the semiconductor material layer and light having a corresponding color of the semiconductor material layer is generated and penetrate through the semiconductor material layer. For red, green and blue (RGB) three-color micro light-emitting diodes, energy of photons of blue light is greater than energy of photons of green light, energy of the photons of the green light is greater than energy of photons of red light. In the case that a display device only displays the blue light, light rays emitted around the blue micro light-emitting diode can be absorbed by the semiconductor material layer of the peripheral green micro light-emitting diode and the peripheral red micro light-emitting diode, weak green light and red light are generated, resulting in a problem that color of a micro light-emitting diode display device is not pure.

According to the embodiment of the present disclosure, after the micro light-emitting diode is arranged in the corresponding sub-pixel region on the drive substrate, the method further comprises: forming a distributed Bragg reflection dielectric film on a light emitting side of the micro light-emitting diode, namely a side away from the drive substrate, wherein reflectivity of the distributed Bragg reflection dielectric film is less than reflectivity of the first electrode in the micro light-emitting diode. Thus, the distributed Bragg reflection dielectric film and the first electrode can form a resonant cavity, a resonant cavity micro light-emitting diode is obtained, the resonant cavity micro light-emitting diode is good in light outputting directivity and small in divergence angle, and therefore influences between the micro light-emitting diodes of different colors in a display device adopting the micro light-emitting diode array substrate can be reduced, and color purity of the micro light-emitting diode display device is increased.

For example, referring to FIG. 6, the distributed Bragg reflection dielectric film 400 is arranged on the light emitting side of the micro light-emitting diode 200, and the distributed Bragg reflection dielectric film 400 and the first electrode form the resonant cavity, so that the color purity of the micro light-emitting diode display device is increased.

A method for forming the distributed Bragg reflection dielectric film is not specially limited. For example, according to the embodiment of the present disclosure, the distributed Bragg reflection dielectric film can be formed on the light emitting side of the micro light-emitting diode by adopting an evaporation method.

According to the embodiment of the present disclosure, the distributed Bragg reflection dielectric film is composed of a plurality of sub-layers arranged periodically and alternately, and the sub-layer includes tantalum pentoxide and silicon oxide. Thus, the distributed Bragg reflection dielectric film can be formed by using the above material, and a resonance effect between the distributed Bragg reflection dielectric film and the first electrode is enhanced easily.

According to the embodiment of the present disclosure, a thickness of the sub-layer is $\lambda/4n$, where $\lambda$ is a wavelength of a light-emitting center of a quantum well, and n is a refractive index of a material forming the sub-layer. Thus, the resonance effect between the distributed Bragg reflection dielectric film and the first electrode can be further enhanced, and the color purity of the micro light-emitting diode display device is increased.

Another embodiment of the present disclosure provides a micro light-emitting diode array substrate. According to the embodiment of the present disclosure, the micro light-emitting diode array substrate is manufactured by using the above-mentioned method. Thus, the micro light-emitting diode array substrate has all characteristics and advantages of the micro light-emitting diode array substrate manufactured according to the method described above, which will not be repeated any more herein. To sum up, the micro light-emitting diode array substrate can achieve colored display and its preparation process is efficient.

The present disclosure further provides a micro light-emitting diode display device. According to the embodiment of the present disclosure, the micro light-emitting diode display device comprises the micro light-emitting diode array substrate described above. Thus, the micro light-emitting diode display device has all characteristics and advantages of the micro light-emitting diode array substrate described above, which will not be repeated any more herein. To sum up, the micro light-emitting diode display device can achieve colored display.

In the disclosure, the following should be noted:

(1) The accompanying drawings involve only the structure(s) in connection with the embodiment(s) of the present disclosure, and other structure(s) can be referred to common design(s).

(2) For the purpose of clarity only, in accompanying drawings for illustrating the embodiment(s) of the present disclosure, the thickness and a size of a layer or area may be enlarged or narrowed, that is, the drawings are not drawn in a real scale.

(3) In case of no conflict, features in one embodiment or in different embodiments can be combined as a new embodiment.

What is described above is related to the illustrative embodiments of the disclosure only and not limitative to the scope of the disclosure; the scopes of the disclosure are defined by the accompanying claims.

The invention claimed is:

1. A method for manufacturing a micro light-emitting diode array substrate, comprising:
providing a drive substrate, the drive substrate comprising a plurality of sub-pixel regions, the plurality of sub-pixel regions being configured for bearing micro light-emitting diodes of different colors, and epitaxial layers of the micro light-emitting diodes of different colors having different thicknesses;
providing a base substrate, forming a plurality of micro light-emitting diodes on the base substrate, and transferring micro light-emitting diodes of same color on the base substrate as a whole onto the drive substrate; and
repeating the transferring the micro light-emitting diodes of same color on the base substrate as a whole onto the drive substrate in a sequence that the thicknesses of the epitaxial layers of the micro light-emitting diodes gradually increase, until each of the plurality of sub-pixel regions in pixel unit is provided with one of the micro light-emitting diodes having same color as the each sub-pixel region,
wherein after the transferring the micro light-emitting diodes of the same color on the base substrate as a whole onto the drive substrate, the method further comprises:
forming a distributed Bragg reflection dielectric film on a side of the micro light-emitting diodes away from the drive substrate.

2. The method according to claim 1, wherein a blank region is formed between two micro light-emitting diodes, and the two micro light-emitting diodes correspond to two adjacent pixel units in a same row on the base substrate respectively.

3. The method according to claim 1, wherein, among the micro light-emitting diodes and the plurality of the sub-pixel regions having same color as the micro light-emitting diodes, a total number of the plurality of the sub-pixel regions is an integral multiple of a total number of the micro light-emitting diodes on each base substrate.

4. The method according to claim 1, wherein the drive substrate comprises an outermost layer electrode, and the outermost layer electrode and the micro light-emitting diode are bonded to each other.

5. The method according to claim 1, wherein the micro light-emitting diodes of the different colors comprising a blue micro light-emitting diode, a green micro light-emitting diode, and a red micro light-emitting diode, and the thicknesses of epitaxial layers of the blue micro light-emitting diode, the green micro light-emitting diode and the red micro light-emitting diode gradually increase.

6. The method according to claim 1, wherein the distributed Bragg reflection dielectric film is composed of a plurality of sub-layers arranged periodically and alternately, and the sub-layer comprises tantalum pentoxide and silicon oxide.

7. The method according to claim 6, wherein a thickness of the sub-layer is $\lambda/4n$, where $\lambda$ is a wavelength of a light-emitting center of a quantum well, and $n$ is a refractive index of a material of the sub-layer.

8. The method according to claim 1, wherein the micro light-emitting diode comprises a first electrode, an epitaxial layer, and a second electrode, and reflectivity of the distributed Bragg reflection dielectric film is less than reflectivity of the first electrode in the micro light-emitting diode.

9. The method according to claim 8, wherein the forming the micro light-emitting diode comprises:
growing a semiconductor material layer on the base substrate;
forming a plurality of epitaxial layers arranged in an array by performing a patterning process on the semiconductor material layer; and
forming the first electrode and the second electrode on a side of the epitaxial layer away from the base substrate, an area of the first electrode being greater than an area of the second electrode.

10. The method according to claim 8, wherein the forming the micro light-emitting diode comprises:
providing a transfer substrate, and growing a semiconductor material layer on the transfer substrate;
transferring the semiconductor material layer on the transfer substrate onto the base substrate, and removing the transfer substrate;
forming a plurality of epitaxial layers arranged in an array by performing a patterning process on the semiconductor material layer on the base substrate; and
forming the first electrode and the second electrode on a side of the epitaxial layer away from the base substrate, an area of the first electrode being greater than an area of the second electrode.

11. The method according to claim 1, wherein the base substrate comprises a plurality of base substrates, each base substrate comprises a plurality of micro light-emitting diodes of same color, and the plurality of base substrates are different from one another in color of the micro light-emitting diodes.

12. The method according to claim 11, after the transferring the micro light-emitting diodes of same color for each time, the method further comprises: stripping off the base substrate.

13. The method according to claim 12, comprising:
providing a first base substrate having a plurality of micro light-emitting diodes of a first color formed thereon, and transferring the plurality of micro light-emitting diodes of the first color as a whole onto the drive substrate; and
stripping off the first base substrate.

14. The method according to claim 13, wherein after the stripping off the first base substrate, the method further comprises:
providing a second base substrate having a plurality of micro light-emitting diodes of a second color formed thereon, and transferring the plurality of micro light-emitting diodes of the second color as a whole onto the drive substrate; and
stripping off the second base substrate.

15. The method according to claim 14, wherein the base substrate is stripped off by wet etching, dry etching, or laser stripping.

16. The method according to claim 14, wherein after the stripping off the second base substrate, the method further comprises:
providing a third base substrate having a plurality of micro light-emitting diodes of a third color formed thereon, and transferring the plurality of micro light-emitting diodes of the third color as a whole onto the drive substrate; and stripping off the third base substrate.

17. The method according to claim 16, wherein the first color comprises blue, the second color comprises green, and the third color comprises red.

* * * * *